United States Patent
Dabral et al.

(10) Patent No.: US 11,836,888 B2
(45) Date of Patent: Dec. 5, 2023

(54) METHOD AND APPARATUS FOR PROCESSING RGB-INFRARED (RGB-IR) SENSOR

(71) Applicant: Texas Instruments Incorporated, Dallas, TX (US)

(72) Inventors: Shashank Dabral, Allen, TX (US); Gang Hua, Katy, TX (US); Mihir Narendra Mody, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 148 days.

(21) Appl. No.: 17/129,818

(22) Filed: Dec. 21, 2020

(65) Prior Publication Data

US 2022/0198604 A1    Jun. 23, 2022

(51) Int. Cl.
| | |
|---|---|
| *G06T 3/40* | (2006.01) |
| *H04N 5/33* | (2023.01) |
| *H01L 27/146* | (2006.01) |
| *H04N 25/13* | (2023.01) |
| *H04N 25/131* | (2023.01) |

(52) U.S. Cl.
CPC ...... *G06T 3/4015* (2013.01); *H01L 27/14621* (2013.01); *H01L 27/14649* (2013.01); *H04N 5/33* (2013.01); *H04N 25/134* (2023.01); *H04N 25/131* (2023.01)

(58) Field of Classification Search
CPC .... G06T 3/4015; H04N 9/04557; H04N 5/33; H01L 27/14621; H01L 27/14649
See application file for complete search history.

(56) References Cited

U.S. PATENT DOCUMENTS

| | | | |
|---|---|---|---|
| 10,336,471 B2 | 7/2019 | Dabral et al. | |
| 10,728,446 B2 | 7/2020 | Zhou et al. | |
| 10,735,700 B2 | 8/2020 | Dabral et al. | |
| 2020/0126378 A1* | 4/2020 | Van Cleave | H04N 23/56 |

FOREIGN PATENT DOCUMENTS

CN        113365034 A    *  9/2021

OTHER PUBLICATIONS

"TDA4VM Jacinto Automotive Processors for ADAS and Autonomous Vehicles Silicon Revision 1.0", SPRSP36E, Texas Instruments, Inc., Feb. 2019, Revised Dec. 2019, pp. 1-311.

* cited by examiner

*Primary Examiner* — Hesham K Abouzahra
(74) *Attorney, Agent, or Firm* — Brian D. Graham; Frank D. Cimino (57) ABSTRACT

A method for processing RGB-Infrared (RGB-IR) sensor data is provided that includes receiving a raw RGB-IR image, determining whether to process the raw RGB-IR image in day mode or night mode, generating, when day mode is determined, an infrared (IR) subtracted raw Bayer image from the raw RGB-IR image and processing the IR subtracted raw Bayer image in an image signal processor (ISP), and generating, when night mode is determined, an IR image from the raw RGB-IR image.

27 Claims, 10 Drawing Sheets

METHOD AND APPARATUS FOR PROCESSING RGB-INFRARED (RGB-IR) SENSOR

BACKGROUND

Image sensors typically used in real-time applications, e.g., automotive, surveillance, and robotic applications, typically provide raw sensor data in the form of a color filter array (CFA) which is an m×n array of pixels (where m and n are the dimensions of the sensor) in which each pixel carries information about one color channel. In the de-facto Bayer 2×2 CFA, 50% of the pixels are green, 25% are red, and 25% are blue. For consumption by a human or machine, an image processing pipeline performs a process referred to as CFA interpolation in which pixels are up-sampled from one color per location to three colors per location.

A new type of image sensor referred to as an RGB-Infrared (RGB-IR) sensor is becoming of interest for use in vision applications that need to operate safely during the day and at night, e.g., in-cabin driver monitoring systems. An RGB-IR sensor provides an infrared (IR) pixel in addition to the red, green, and blue pixels. That is, an RGB-IR sensor provides raw sensor data in a 4×4 CFA pattern in which one pixel is an IR pixel, one is a red pixel, one is a green pixel, and one is a blue pixel. Such sensor output does not map well to image system processors (ISPs) currently used in real-time applications due to the presence of the additional IR pixel plane.

SUMMARY

Embodiments of the present disclosure relate to processing of RGB-Infrared (RGB-IR sensor data. In one aspect, a method for processing RGB-Infrared (RGB-IR) sensor data is provided that includes receiving a raw RGB-IR image, determining whether to process the raw RGB-IR image in day mode or night mode, generating, when day mode is determined, an infrared (IR) subtracted raw Bayer image from the raw RGB-IR image and processing the IR subtracted raw Bayer image in an image signal processor (ISP), and generating, when night mode is determined, an IR image from the raw RGB-IR image.

In one aspect, a system-on-a-chip (SoC) is provided that includes an image signal processor (ISP) configured to process a raw RGB-Infrared (RGB-IR) image in day mode or night mode, wherein, when configured for day mode, the ISP generates an infrared (IR) subtracted raw Bayer image from the raw RGB-IR image and, when configured for night mode, the ISP generates an IR image from the RGB-IR image, a memory configured to store software instructions implementing a control program for the ISP, wherein the control program comprises software instructions to determine whether to process the raw RGB-IR image in day mode or night mode and to configure the ISP accordingly, and at least one processor coupled to the memory to execute the software instructions.

In one aspect, a color filter array (CFA) interpolation component is provided that includes a plurality of filters, wherein, when the CFA interpolation component is operated in a first mode, a first filter and a second filter of the plurality of filters are configured to interpolate a raw Bayer image from a raw RGB-infrared (RGB-IR) image and a third filter of the plurality of filters is configured to interpolate an IR image from the raw RGB-IR image, a coefficient table configured to store coefficients for each filter of the plurality of filters, a pixel storage block configured to store raw RGB-infrared (RGB-IR) image pixels from the raw RGB-IR image for interpolation by the first filter, the second filter and third filter, an output select component coupled to the plurality of filters and configured to select outputs of the first filter and the second filter in a correct order for the raw Bayer image, and an IR subtract component configured to perform IR subtraction on the raw Bayer image using the IR image.

DETAILED DESCRIPTION

Figure 1:
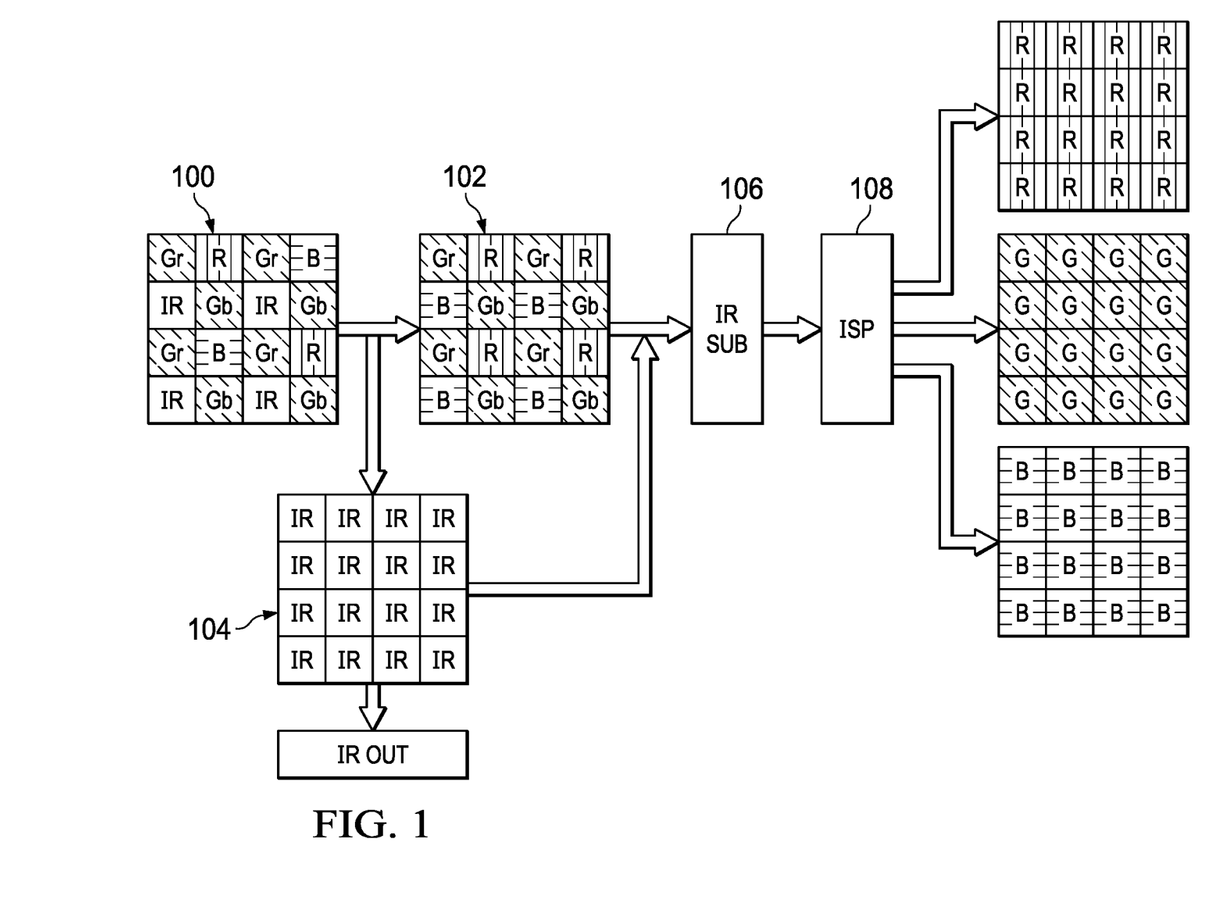
FIG. 1 illustrates the general operation of a software based approach to using an RGB-Infrared (RGB-IR) sensor with an image signal processor (ISP) designed to process four channel image data.

Specific embodiments of the disclosure are described herein in detail with reference to the accompanying figures. Like elements in the various figures are denoted by like reference numerals for consistency FIG. 1 illustrates the general operation of a software based approach to using an RGB-Infrared (RGB-IR) sensor with an image signal processor (ISP) designed to process four channel image data. In this approach, a software program separates each 4×4 array 100 of the raw RGB-IR sensor data into a 4×4 array 102 of four 2×2 raw Bayer arrays and an array 104 of IR pixels. The software program also performs infrared (IR) subtraction 106 on the raw Bayer array 102 to remove the IR component from the raw Bayer pixels. The resulting modified raw Bayer plane data is then processed by the ISP 108 to generate de-mosaiced pixels, i.e., to reconstruct full color pixels. The IR plane data 104 may be stored for additional processing.

While this approach allows ISPs that are not designed to process sixteen channel raw RGB-IR image data to support RGB-IR processing, the images generated from the Bayer data may have clipping and banding artifacts. Further, night mode IR illuminated images tend to have poor resolution.

Figure 2:
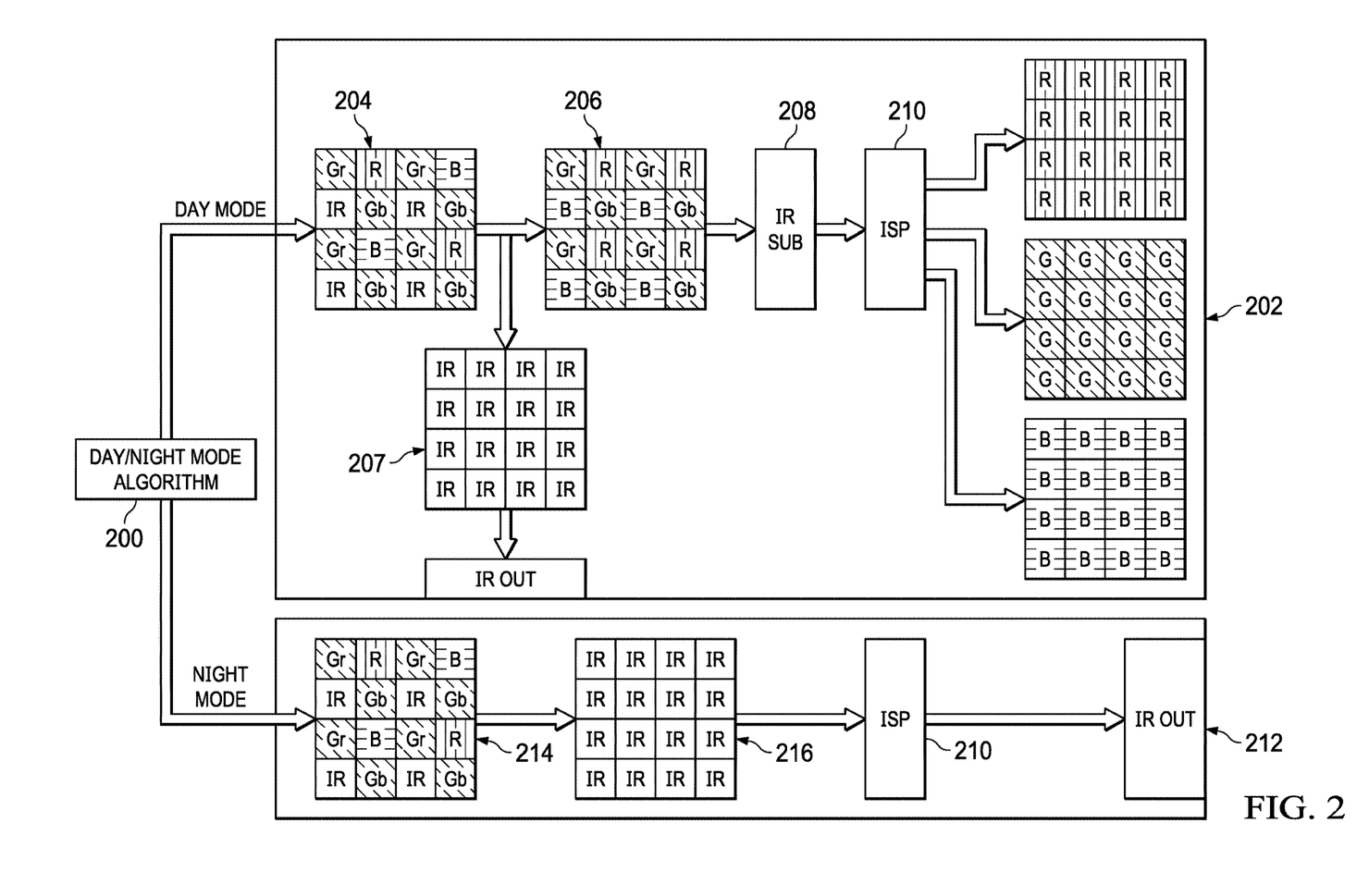
FIG. 2 illustrates the general operation of an approach to using an RGB-IR sensor with an ISP designed to process four channel image data.

FIG. 2 illustrates the general operation of an approach to using an RGB-IR sensor with an ISP designed to process four channel image data in accordance with some embodiments. In this approach, a day mode and a night mode of operation are provided. A software algorithm 200 is provided that selects between day mode and. night mode and causes the input raw RGB-IR image data to be processed accordingly. An example of such an algorithm is described herein in reference to FIG. 7. In day mode, the general flow 202 of processing the RGB-IR sensor data is similar that shown in FIG. 1. The raw RGB-IR image data 204 is interpolated to generate raw Bayer image data 206 and IR image data 208. Examples of interpolation to generate raw Bayer image data and IR data are described herein in reference to FIG. 3 and FIG. 4. IR subtraction 208 is also performed on the raw Bayer image data 206 to remove the IR component from the raw Bayer pixels. The resulting raw Bayer image data is then processed by the ISP 210 to generate de-mosaiced Bayer planes.

The IR subtraction 206 is improved over the prior art IR subtraction 108 to include corner case artifact mitigation and improved color fidelity. To improve image quality, rather than performing simple IR subtraction in which each IR pixel value 207 is subtracted from the color pixel value in the corresponding location in the raw Bayer image 206, e.g., C_Out=C_In−IR_In, the value of the IR pixel is mixed with the value of the corresponding color pixel, e.g., C_Out=Wc*C_In+$W_{IR}$*IR_in//Wc is close to 1 and $W_{IR}$ is close to −1 and C=R, B, or G. The weights may be programmable and each color channel may have a different weight. In addition, thresholding may be applied to help mitigate the effects of some corner cases. The use of thresholds is explained in more detail herein in reference to FIG. 5.

In night mode 204, the general flow 212 of processing the raw RGB-IR sensor data 214 is to generate IR image data 216 based on the raw RGB-IR image data 214. The resulting IR image data is then processed by the ISP 210 to generate the final IR image data. The IR image data 216 may be generated, for example, by interpolating the raw RGB-IR image data. An example of such interpolation is described herein in reference to FIG. 4. In another example, the IR image data 216 may be generated by applying a gain to each color channel in each 4×4 RGB-IR CFA array and then applying a large cutoff low-pass filter or all-pass filter to the resulting image data. More specifically, the filter response is tuned such that valid image data is retained while high frequency components which may be introduced due to difference in spectral responses of the color channels are eliminated. An example illustrating this approach is described in more detail herein in reference to FIG. 6.

Figure 3:
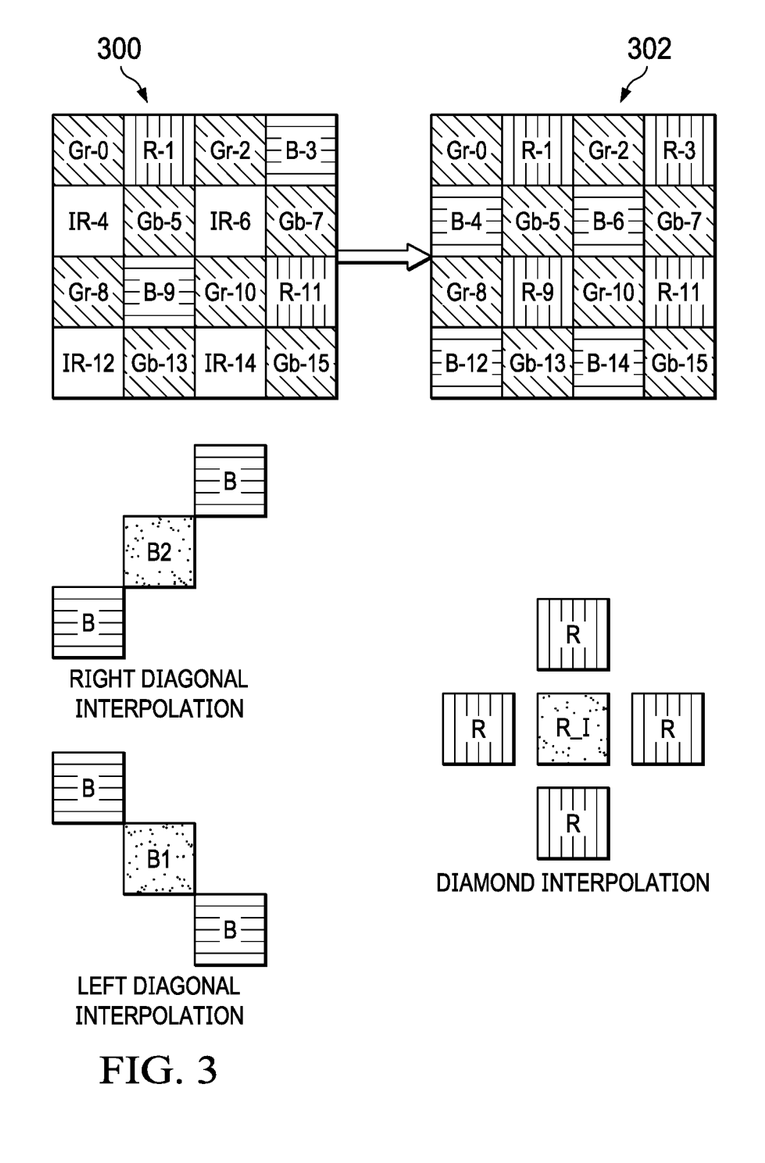
FIG. 3 is an example illustrating an approach to interpolating raw RGB-IR image data to generate raw Bayer image data.

FIG. 3 is an example illustrating an approach to interpolating raw RGB-IR image data 204 to generate raw Bayer image data 206 that can be used in day mode. Each 4×4 RGB-IR CFA array 300 is converted to four Bayer CFA arrays 302. The green pixels in the 4×4 RGB-IR CFA array 300 and in the four Bayer CFA arrays 302 are in corresponding locations so the value of each green pixel in the RGB-IR array 300 can be copied to the corresponding location in the four Bayer CFA arrays 302. In addition, the red pixels R-1 and R-11 in the RGB-IR CFA array 300 and in the four Bayer CFA arrays 302 are in corresponding locations so the values of these two red pixels in the RGB-IR CFA array 300 can also be copied to corresponding locations in the four Bayer CFA arrays 302.

The values of the other two red pixels R-3 and R-9 in the four Bayer CFA arrays 302 are interpolated from nearby red pixels in the RGB-IR image as the pixels in the corresponding locations of the RGB-IR CFA array 300 are blue. As shown in FIG. 3, a diamond interpolation pattern is used in which the red pixels used for the interpolation are top, left, bottom, and right pixels spaced apart from the pixel location that is the target of the interpolation by one pixel. The diamond interpolation is a weighted average of the four red pixels. Any suitable weights that add up to one may be used.

The four blue pixels in the four Bayer CFA arrays 302 correspond to locations of the four IR pixels in the RGB-IR CFA array 300 and the values of these pixels are interpolated from diagonally neighboring blue pixels of the IR pixels in the RGB-IR image. As shown FIG. 3, to interpolate blue values for B-4 and B-14, the values of the neighboring blue pixels on a left diagonal of IR-4 and IR-14, respectively, are used. To interpolate blue values for B-6 and B-12, the values of the neighboring blue pixels on a right diagonal of IR-6 and IR-12, respectively, are used. The diagonal interpolations are weighted averages of the respective two blue pixels. Any suitable weights that add up to one may be used.

Figure 4:
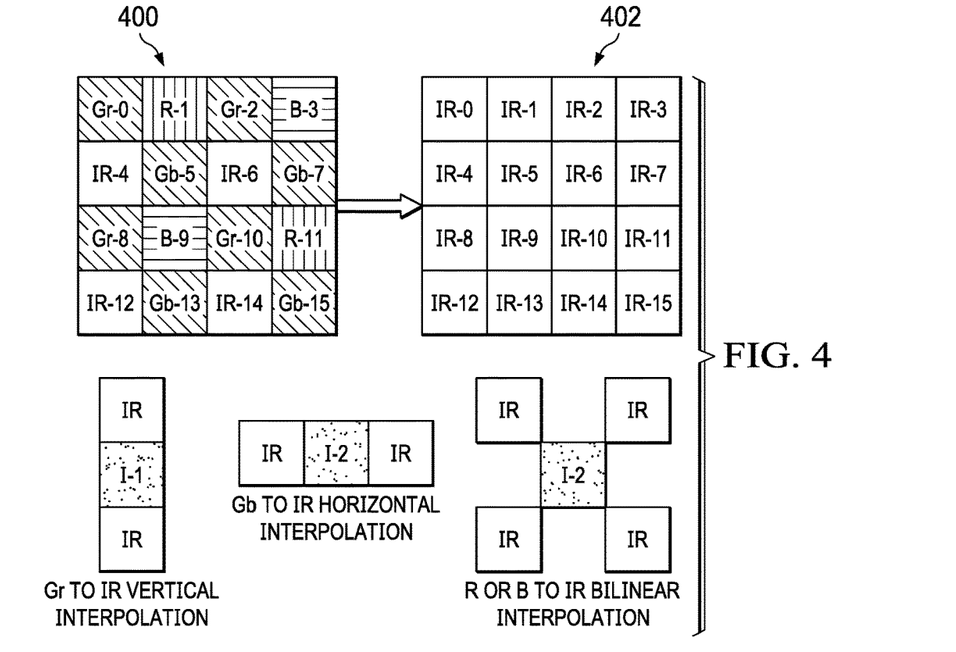
FIG. 4 is an example illustrating an approach to interpolating raw RGB-IR image data to generate infrared (IR) image data.

FIG. 4 is an example illustrating an approach to interpolating raw RGB-IR image data 204 to generate IR image data 207 that can be used for IR subtraction in day mode or as IR image data 216 in night mode. Each 4×4 RGB-IR CFA array 400 is converted to a 4×4 IR array 402. The four IR pixels in the RGB-IR CFA array 400 need no interpolation and their values can be copied to corresponding locations in the IR array 402.

The IR pixels IR-0, IR-2, IR-8, and IR-10 in the IR array 402 correspond to locations of the four Gr pixels Gr-0, Gr-2, Gr-8, and Gr-10 in the RBG-IR array 400. As shown in FIG. 4, IR values for these pixels are vertically interpolated from the values of top and bottom neighboring IR pixels of the respective Gr pixel. The IR pixels IR-5, IR-7, IR-13, and IR-15 in the IR array 402 correspond to locations of the four Gb pixels Gb-5, Gb-7, Gb-13, and Gb-15 in the RBG-IR array 400. As shown in FIG. 4, IR values for these pixels are horizontally interpolated from the values of left and right neighboring IR pixels of the respective Gb pixel. The horizontal and vertical interpolations are weighted averages of the respective two IR pixels. Any suitable weights that add up to one may be used.

The IR pixels IR-1, IR-3, IR-9, and IR-11 in the IR array 402 correspond to locations of the red and blue pixels R-1, B-3, B-9, and R-11 in the RBG-IR array 400. As shown in FIG. 4, IR values for these pixels are bilinearly interpolated from the values of the four corner neighboring IR pixels, i.e., top left, top right, bottom left and bottom right neighboring IR pixels, of the respective red or blue pixel.

Figure 5:
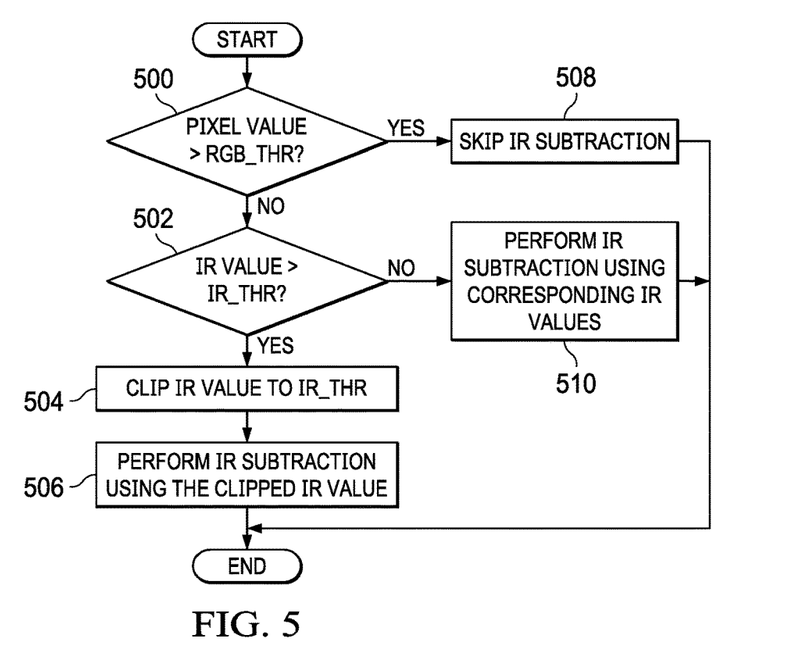
FIG. 5 is a flow diagram of a method for using thresholds to mitigate artifacts caused by corner cases in IR subtraction.

FIG. 5 is a flow diagram of a method for using thresholds to mitigate artifacts caused by corner cases in IR subtraction. IR subtraction works well under normal lighting conditions but may provide bad results under extreme lighting conditions. For example, if an RGB pixel is saturated, the IR pixel cannot be subtracted correctly and it is best not to perform IR subtraction at all. To handle such corner cases, a programmable threshold is used to set the saturation limit on the RGB pixels such that IR subtraction is not performed the saturation of an RGB pixel exceeds the threshold.

At the other end of the spectrum, the IR plane could have much higher illumination than the color planes which can cause color artifacts due to clipping. To mitigate such issues, an IR threshold is used to prevent color inversion caused by the value of an RGFB pixel being reduced to zero or close to zero due to IR subtraction.

Referring again to FIG. 5, the method may be applied to each raw Bayer pixel (after interpolation from raw RGB-IR image data). Initially, the RGB pixel is compared 500 to a RGB saturation threshold RGB_THR. Any suitable value may be used for the saturation threshold and such value may be determined empirically based, for example, on the usage scenario for the RGB-IR sensor. If the value of the RGB pixel exceeds this threshold, IR subtraction is skipped 508.

If the RGB pixel value does not exceed this threshold, then IR thresholding is considered 502. If the IR value corresponding to the RGB pixel value does not exceed an IR threshold IR_THR, then IR subtraction is performed 510 using the corresponding IR value. If the IR value corresponding to the RGB pixel value exceeds 502 an IR threshold IR_THR, then the IR value used for IR subtraction is clipped 504 to the IR_THR value and IR subtraction is performed 506 using the clipped IR value.

In some embodiments, the IR channel threshold is a static threshold. Any suitable value may be used for the static IR channel threshold and such value may be determined empirically based, for example, on the usage scenario for the RGB-IR sensor. In some embodiments, the IR channel threshold is dynamic and is computed as a percentage of the incoming R, G, or B pixel value. For example, if the percentage is 75%, R=3500, and IR=3400, then IR_THR=min(0.75*3500, 3400)=2625. Any suitable value may be used for the percentage to compute the dynamic IR channel threshold and such value may be determined empirically based, for example, on the usage scenario for the RGB-IR sensor.

There may also corner cases in which some pixels in the RGB array are saturated and the others are not. In some embodiments, to mitigate this issue, the saturation threshold decision is taken not at a pixel boundary but rather at the boundary of a 2×2 Bayer array. Thus, if any color pixel in the 2×2 Bayer array (after interpolation) is saturated, IR subtraction is not performed on any pixel in the array.

Figure 6:
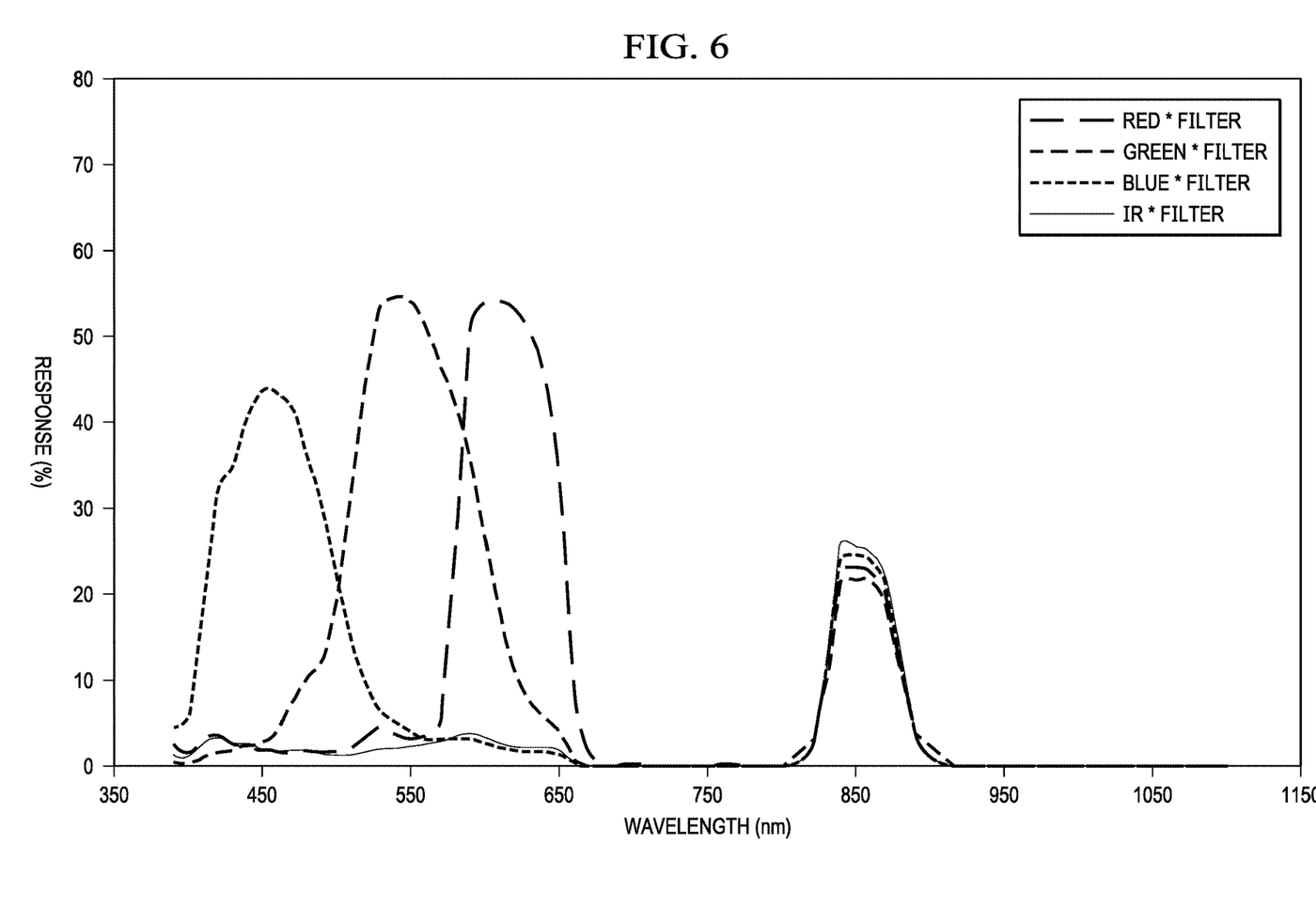
FIG. 6 shows the quantum efficiency (QE) curve of an example RGB-IR sensor.

As previously mentioned here in reference to night mode 204 in FIG. 2, IR image data may be generated by applying a gain to each color channel in each 4×4 RGB-IR CFA array and then applying an all-pass filter to the resulting image data. The goal of this approach is to match the quality of native IR monochrome sensors using RGB-IR sensor data having one fourth the density of IR pixels as compared to native IR monochrome sensors. Analysis of the quantum efficiency (QE) curve of an RGB-IR filter provides insight into higher quality rendering of IR pixels. FIG. 6 shows a QE curve of an On Semiconductor AR239 RGB-IR sensor. As this QE curve illustrates, in the 850 nm range (IR LED emitter zone) the response of the RGB channels is very similar to that of the IR channels. Accordingly, a much higher resolution IR image can be generated if the color pixels of the RGB-IR image data are mixed with the IR pixels instead of interpolating missing IR pixels values in the IR image from IR pixel values in the RGB-IR image data.

To generate IR pixels in the IR image, a gain adjustment is applied to each pixel in each 4×4 RGB-IR CFA array followed by application of an all-pass filter. There is an independent gain value for each of the sixteen phases in the 4×4 RGB-IR array. The gain values may be chosen to resolve the coarse delta between the responses of the color channels and IR channels. Because the QE ratio between the color channels and the IR channels is not constant across the full IR spectrum, applications of the gains does not resolve all the differences. The all pass filter is designed to smooth out the residual differences between the channels.

Figure 7:
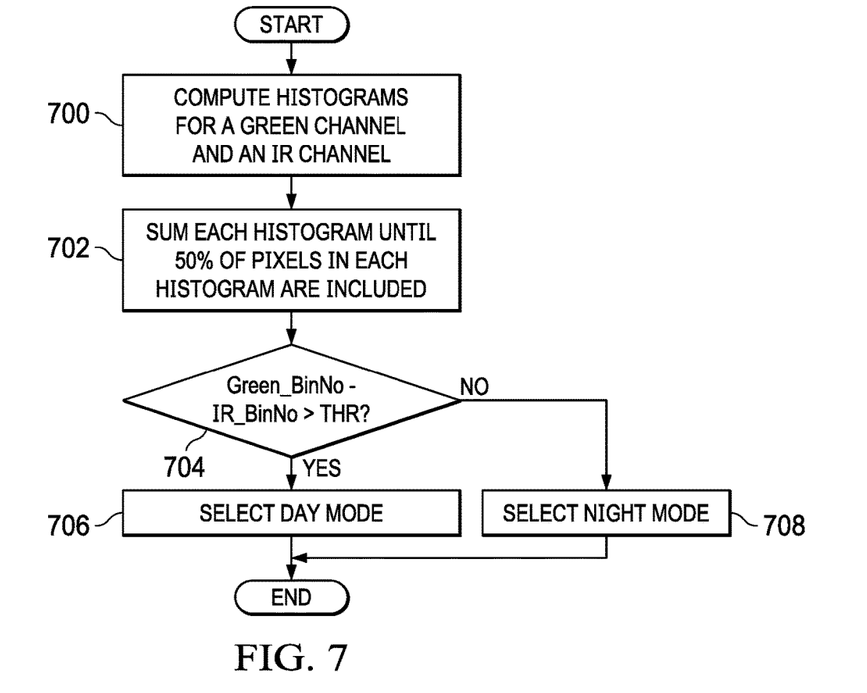
FIG. 7 is a flow diagram of a method for selection between day mode and night mode for processing of image data from an RGB-IR sensor.

FIG. 7 is a flow diagram of a method for selection between day mode and night mode for processing of image data from an RGB-IR sensor in accordance with some embodiments. This method may be performed for each image provided by the RGB-IR sensor. Initially, separate histograms for one green channel and one IR channel in each 4×4 RGB-IR CFA array are computed 700 across the RGB-IR image. Any green channel or IR channel may be used. The histograms may have any suitable number of bins. In some embodiments, 128 bins are used, with the bin numbers ranging from 0 to 127. As can be seen from the QE curve of FIG. 6, in the visible spectrum corresponding to day light, the IR channel histogram would be significantly biased toward the left side of the curve, i.e., the lower QE of the IR spectrum, and in the 850-950 nm range corresponding to night, the IR channel histogram and the green channel histogram would have a similar shape.

Once the histograms are computed, each histogram is summed 702 beginning with the first bin, bin 0, until 50% of the total number of pixels in the histogram is included in the sum. If the difference 704 between the bin number of the green histogram where the green sum reached the 50% pixel count and the bin number of the IR histogram where the IR sum reached the 50% pixel count is greater than 704 a threshold, then day mode is selected 706. Otherwise, night mode is selected 708. The threshold may be empirically determined, e.g., by examining the histograms for IR and green channels under various lighting conditions. In some embodiments, the day mode versus night mode decision applies to the image used to generate the histograms. In some embodiments, the day mode versus night mode decision applies to the image following the image used to generate the histograms.

In the above descriptions, the day mode processing to generate a raw Bayer image and an IR image from a raw RGB-IR image and the IR subtraction is performed before the resulting raw Bayer image is processed by an ISP to generate the RGB planes. Similarly, the night mode processing to generate the IR image from the raw RBG-IR image is performed before the IR image is processed by an ISP. In some embodiments, the day mode and night mode processing can be performed by an ISP using a programmable CFA interpolation component included in the ISP.

Figure 8:
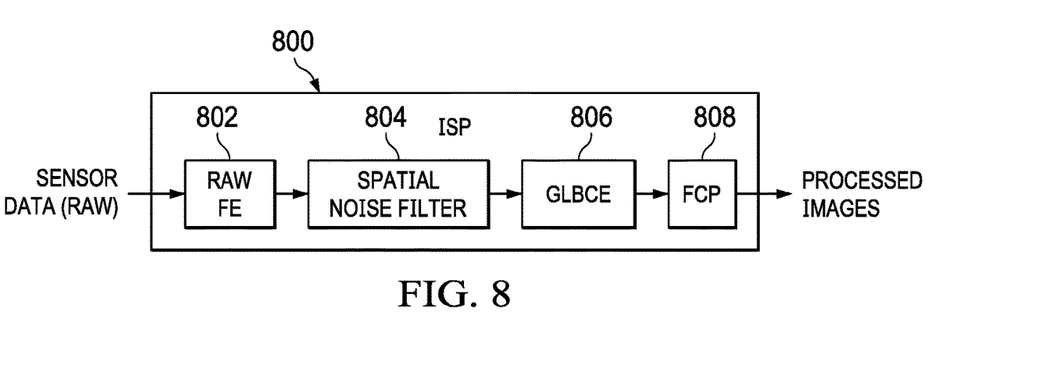
FIG. 8 is a simplified block diagram of an example image signal processor (ISP)

FIG. 8 is a simplified block diagram of an example ISP 800 configured to perform RGB-IR data processing. The ISP 800 implements an image processing pipeline that includes a raw front end (FE) component 802, a spatial noise filter component 804, a global/local brightness and contrast enhancement (GLBCE) component 806, and a flexible color processing (FCP) component 808.

The raw FE component 802 operates as an image processing front end in the raw domain. The raw FE component 802 includes functionality to receive raw sensor data and perform raw pixel processing operations such as decompanding, defective pixel correction, and lens shading correction.

The spatial noise filter component 804 includes functionality to perform spatial noise filtering on the image received from the raw FE component 802.

The GLBCE component 806 includes functionality to perform global and local brightness and contrast enhancement on the image received from the spatial noise filter component 804.

The FCP component 808 includes functionality to perform de-mosaicing and color conversion on the image received from the GLBCE component 806. The image output by the FCP component 808 is stored in memory (not shown) for further processing by other hardware components, e.g., a vision processing accelerator included in a system-on-a-chip (SoC) with the ISP 800 and/or applications executing on processors in the SoC.

The FCP component 808 includes a programmable CFA interpolation component (not specifically shown) for generation of a full color image from the received image. A CFA interpolation component may also be referred to as a demosaicing component. The CFA interpolation component includes functionality for generating multi-plane output for any 2×2 raw CFA format including, for example, RCBC, RCCC, Bayer, and RGBC. As is explained in more detail herein, the CFA interpolation component can be programmed to generate a Bayer image and an IR image from an RGB-IR image. An example of such a CFA interpolation component is described in more detail herein in reference to FIG. 10. Further, in some embodiments, the CFA interpolation component may also include functionality to perform IR subtraction and to generate an IR image from an RGB-IR image by applying gains and filtering the resulting image data as previously described herein.

Figure 9:
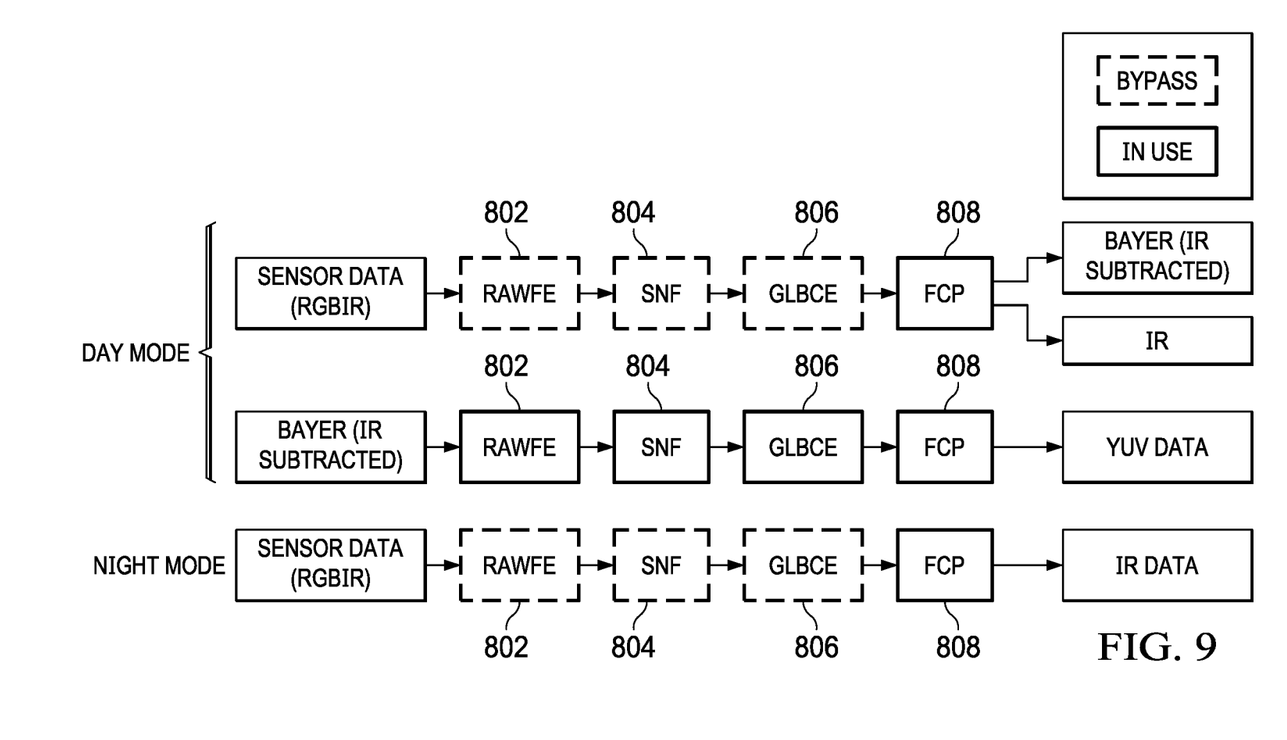
FIG. 9 is an example of the high level flow for processing of RGB-IR image data using the ISP of FIG. 8 in day mode and in night mode.

FIG. 9 is an example of the high level flow for processing of RGB-IR image data using the ISP 800 of FIG. 8 in day mode and in night mode. A control program executing on a processor (not shown) external to the ISP 800 determines whether the incoming RGB-IR image data is to be processed in day mode or night mode, e.g., using an embodiment of the method of FIG. 7, and configures components of the ISP 800 accordingly. In day mode, two passes through the ISP 800 are used to generate the desired image format, e.g., YUV, from the RGB-IR image data. For the first pass, the control program bypasses all components of the ISP 800 except the CFA interpolation component in the FCP 808. In addition, the control program provides configuration parameters for the CFA interpolation component to configure the component to generate Bayer image data and IR image data.

In this example, the control program also provides configuration parameters for the CFA interpolation component to configure the component to perform IR subtraction. Configuration of the CFA interpolation component to perform these functions is described herein in reference to FIG. 10. The input to the ISP 800 for the second pass is the IR subtracted Bayer image data output by the ISP 800. For the second pass, the control program configures the components of the ISP 800 as needed to perform their respective functions on the IR subtracted Bayer image data.

In night mode, a single pass through the ISP 800 is used to generate IR image data from the RGB-IR image data. The control program bypasses all components of the ISP 800 except the CFA interpolation component in the FCP 808. In addition, the control program provides configuration parameters for the CFA interpolation component to configure the component to apply gains to the RGB-IR image data and to apply an all-pass filter to the resulting image data to generate the IR image data. Configuration of the CFA interpolation component to perform these functions is described herein in reference to FIG. 10.

Figure 10:
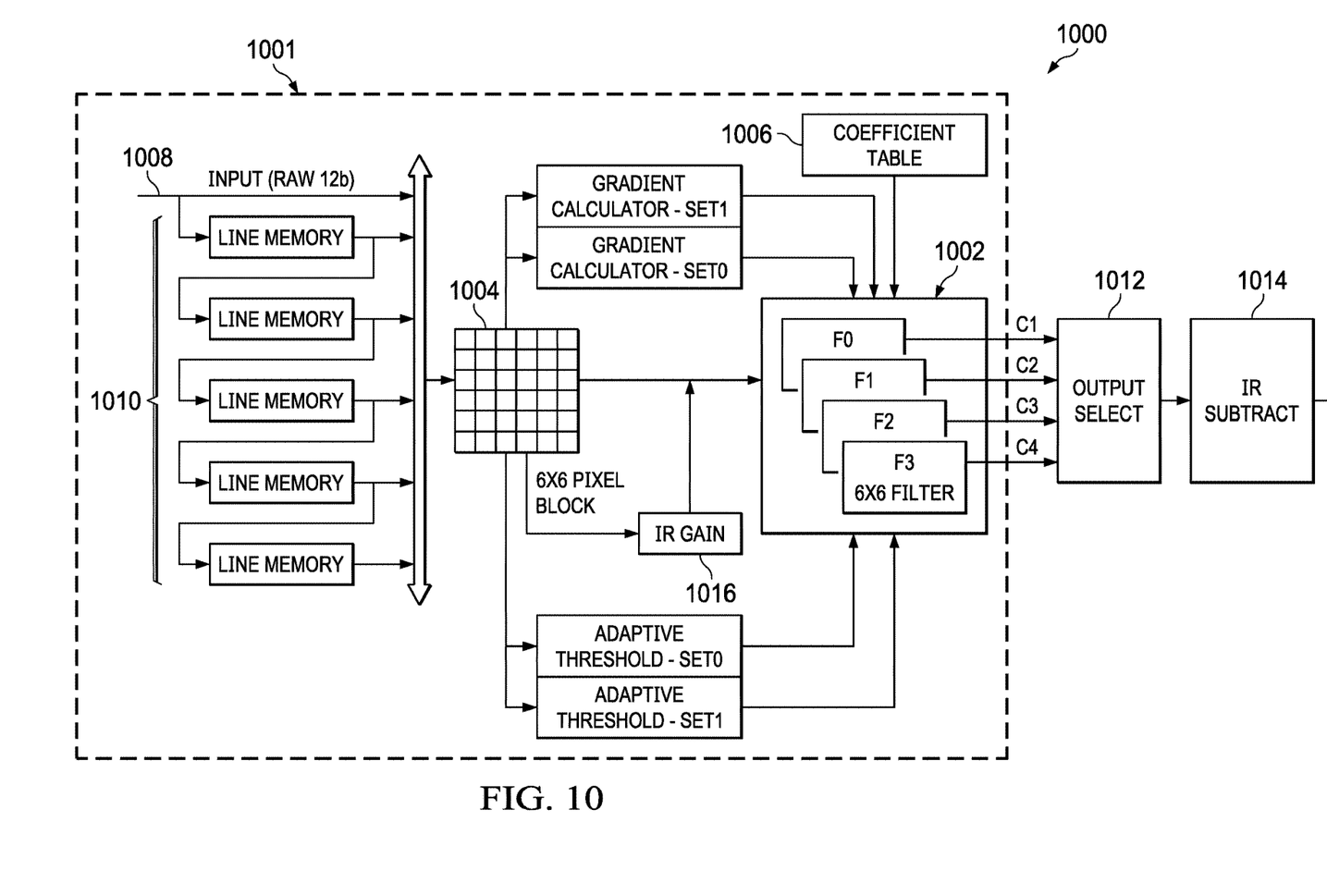
FIG. 10 is a high level block diagram of an example color filter array (CFA) interpolation component that may be included in the ISP of FIG. 8.

FIG. 10 is a high level block diagram of an example CFA interpolation component 1000 that may be included in the FCP 808. The CFA interpolation component 1000 in this example is configurable to interpolate RGB-IR image data to generate Bayer image data and IR data and perform IR subtraction in support of day mode use of an RGB-IR sensor. In addition, the CFA interpolation component 1000 is configurable to generate an IR image from RGB-IR image data by applying gains and filtering the result in support of night mode use of an RGB-IR sensor. Brief descriptions of components in circuitry 1001 of the CFA interpolation component 1000 relevant to embodiments of the disclosure are provided herein. Descriptions of other components in circuitry 1001 and more detailed description of all components (except the IR gain component 1016) in circuitry 1001 may be found, for example, in U.S. Pat. No. 10,735,700, issued Aug. 4, 2020, which is incorporated by reference herein.

The CFA interpolation component 1000 includes line memory 1010, a coefficient table 1006, a filter component 1002 including four configurable finite impulse response (FIR) filters F0-F3, a 6×6 pixel storage block 1004, an output select component 1012, an IR subtract component 1014, and an IR gain component 1016. Each of the four FIR filters F0-F3 can support a filter kernel up to a maximum size of 6×6 and each filter supports four phases. As used herein, the term "phase" refers to a unique pixel location in a CFA array. For example, an RGB-IR CFA array includes sixteen phases and a Bayer CFA array includes four phases.

The pixel storage block 1004 is configured to store a 6×6 "window" of pixels for each interpolation operation. The memory architecture of the CFA interpolation component 1000 is line based such that one incoming line of image data 1008 and the five line buffers 1010 are utilized to fill the pixel storage block 1004. The coefficient table 1006 stores the configurable coefficients for each of the sixteen filter phases. The coefficient table 1006 also include circuitry for tracking the current phase of the pixel being filtered and causing the filters to use the coefficients corresponding to the phase.

The separation of raw RGB-IR image data into raw Bayer image data and IR image data utilizes three of the four FIR filters in the filter component 1002. Two filters, e.g., F0 and F1, are used to interpolate the raw Bayer image data from the raw RGB-IR image data and one filter, e.g., F3, is used to interpolate the IR image data from the raw RGB-IR data. As previously described herein in reference to FIG. 3, a 4×4 RGB-IR CFA array can be converted to four Bayer CFA arrays by copying for all green pixels and certain red pixels from the RGB-IR CFA array to corresponding locations in the four Bayer CFA arrays, performing diamond interpolation for the other red pixels, and performing either left diagonal interpolation or right diagonal interpolation for blue pixels.

Further, as illustrated in Table 1, the pixel values for upper left and lower right Bayer CFA arrays can be generated with the same interpolations in the same order and the pixel values for the upper right and lower left Bayer CFA arrays can be generated with the same interpolations in the same order. More specifically, as shown in Table 1 with reference to the RGB-IR CFA array 300 and the four Bayer CFA arrays 302 of FIG. 3, the interpolation order to generate the pixel values for the upper left and lower right Bayer CFA arrays is copy green (Gr-0 to Gr-0, Gr-10 to Gr-10), copy red (R-1 to R-1, R-11 to R-11), left diagonal blue interpolation (IR-4 to B-4, IR-12 to B-12), and copy green (Gb-5 to Gb-5, Gb-13 to Gb-13). Also, the interpolation order to generate the pixel values for the upper right and lower left Bayer CFA arrays is copy green (Gr-2 to Gr-2, Gr-8 to Gr-8), red diamond interpolation (B-3 to R-3, B-9 to R-9), right diagonal blue interpolation (IR-6 to B-6, IR-12 to B-12), and copy green (Gb-7 to Gb-7, Gb-13 to Gb-13).

To generate the pixel values for the four Bayer CFA arrays, the coefficients for the four phases of the FIR filter F0 can be programmed by the control program via the coefficient table 1006 to perform the copy green, copy red, left diagonal blue, and copy green interpolations to generate the Gr, R, B, and Gb pixel values for the upper left and lower right Bayer CFA arrays and the coefficients for the four phases of the FIR filter F1 can be programmed by the control program via the coefficient table 1006 to perform the copy green, red diamond, right diagonal blue, and copy green interpolations to generate the Gr, R, B, and Gb pixel values for the upper right and lower left Bayer CFA arrays.

TABLE 1

| RGB-IR Phase | Mapped Phase | Operation | Filter |
|---|---|---|---|
| Gr-0 | Gr-0 | Copy | F0 |
| R-1 | R-1 | Copy | F0 |
| Gr-2 | Gr-2 | Copy | F1 |
| B-3 | R-3 | Diamond | F1 |
| IR-4 | B-4 | Left Diagonal | F0 |
| Gb-5 | Gb-5 | Copy | F0 |
| IR-6 | B-6 | Right Diagonal | F1 |
| Gb-7 | Gb-7 | Copy | F1 |
| Gr-8 | Gr-8 | Copy | F1 |
| B-9 | R-9 | Diamond | F1 |
| Gr-10 | Gr-10 | Copy | F0 |
| R-11 | R-11 | Copy | F0 |
| IR-12 | B-12 | Right Diagonal | F1 |
| Gb-13 | Gb-13 | Copy | F1 |
| IR-14 | B-14 | Left Diagonal | F0 |
| Gb-15 | Gb-15 | Copy | F0 |

Figure 11:
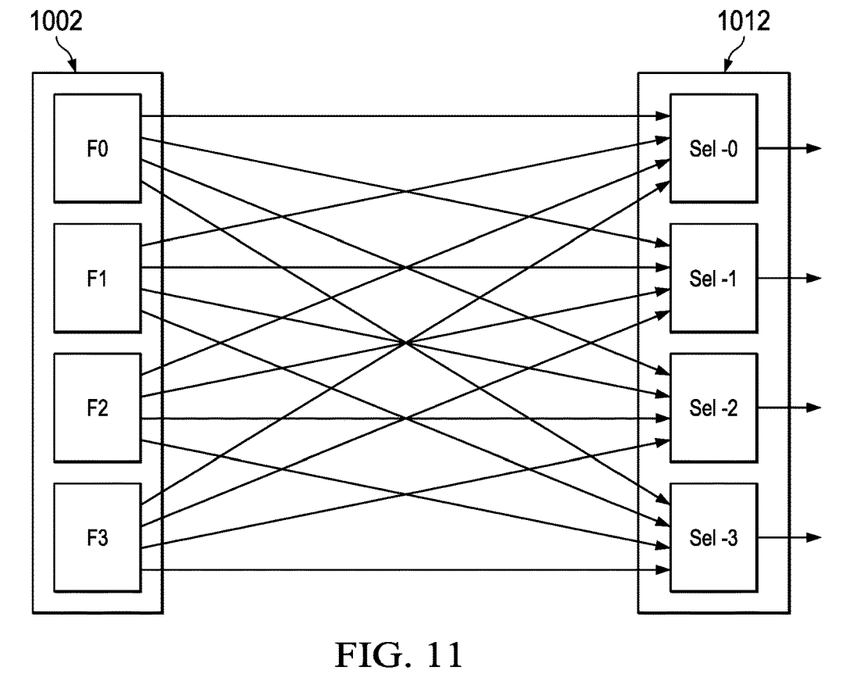
FIG. 11 illustrates an example output select component.

To complete generation of the four Bayer CFA arrays for each RGB-IR CFA array, the color channel outputs of the filters F0 and F1 need to be arranged in the correct order. The output select component 1012 is configurable to select among the outputs of the four filter FIR filters F0-F3 and can be configured to perform the needed ordering. FIG. 11 illustrates an example output select component 1012. The output select component 1012 includes four select blocks, Sel-0-Sel-3, and the outputs of each filter in the filter component 1002 are coupled to inputs of each of the four select blocks. Each of the select blocks includes a 4:1 multiplexer with a 2-bit select line (not specifically shown) for selecting among the four filter inputs. To provide the interpolated pixels to the IR subtract component 1014 in the correct order, the outputs of the filters F0 and F1 need to be mixed in the correct order, which requires on one select block, e.g., Sel-0. Example programming of the select line for Sel-0 to output the pixels in the correct order is shown in Table 2.

TABLE 2

| RGB-IR Phase # | Sel-0 (2 bits) |
|---|---|
| 0 | 0 |
| 1 | 0 |
| 2 | 1 |
| 3 | 1 |
| 4 | 0 |
| 5 | 0 |
| 6 | 1 |
| 7 | 1 |
| 8 | 1 |
| 9 | 1 |
| 10 | 0 |
| 11 | 0 |
| 12 | 1 |
| 13 | 1 |
| 14 | 0 |
| 15 | 0 |

As previously described herein in reference to FIG. 4, a 4×4 RGB-IR CFA array 400 can be converted to a 4×4 IR array 402 by copying the four IR pixels from the RGB-IR CFA array 400 to corresponding locations in the IR array 402, performing vertical interpolation for replace Gr pixels, performing horizontal interpolation to replace Gb pixels, and performing bilinear interpolation to replace red or blue pixels. Table 3 shows the specific interpolation operations for each phase of the RGB-IR CFA array 400 to generate the corresponding IR phase in the IR array 402. To generate the IR pixel values in the IR array, the four phases of the FIR filter F3 can be programmed by the control program via the coefficient table 1006 to perform the copy, vertical, horizontal, and bilinear interpolations. The select line of one of the select blocks, e.g., Sel-3, in the output select component 1012 can be programmed to output the IR pixels to the IR subtract component 1014.

TABLE 3

| Initial Phase | Mapped Phase | Operation |
|---|---|---|
| GR-0 | IR-0 | Vertical |
| R-1 | IR-1 | Bilinear |
| Gr-2 | IR-2 | Vertical |
| B-3 | IR-3 | Bilinear |
| IR-4 | IR-4 | Copy |
| Gb-5 | IR-5 | Horizontal |
| IR-6 | IR-6 | Copy |
| Gb-7 | IR-7 | Horizontal |
| Gr-8 | IR-8 | Vertical |
| B-9 | IR-9 | Bi-linear |
| Gr-10 | IR-10 | Vertical |
| R-11 | IR-11 | Bilinear |
| IR-12 | IR-12 | Copy |
| Gb-13 | IR-13 | Horizontal |
| IR-14 | IR-14 | Copy |
| Gb-15 | IR-15 | Horizontal |

Referring again to FIG. 10, the IR subtract component 1014 is configurable to perform thresholding and IR subtraction as previously described herein. The control program provides a value for the RGB saturation threshold RGB_THR. In some embodiments, the control program provides a static value for IR threshold IR_THR. In other embodiments, the control program provides the percentage for the dynamic calculation of the IR threshold and the IR subtract component 1012 includes circuitry to determine the IR threshold for each Bayer pixel using the percentage as previously described. Further, the control program provides a weight for each color pixel for the IR subtraction and a weight for the IR pixel. The weights for the IR pixel may vary according to the color of the corresponding color pixel.

The control program configures the output select component 1012 and the IR subtract component 1014 for operation during the first pass processing of RGB-IR image data when day mode is selected. Otherwise, these two components may be bypassed.

To generate an IR image from RGB-IR image data in support of night mode use of an RGB-IR sensor, the IR gain component 1016 and one of the filters, e.g., F0, of the filter component are used. The IR gain component 1016 is configurable to apply gains to RGB-IR pixels before the pixels are processed by the filter F0. The control program configures the IR gain component 1016 for operation when night mode is selected. Otherwise, the component may be bypassed. More specifically, the control program provides the sixteen gains to be applied to the sixteen phases in an RGB-IR array. Further, the control program programs the filter F0 via the coefficient table 1006 to operate as an all-pass filter on the output of the IR gain component 1016 to smooth out any residual differences between the channels.

Figure 12:
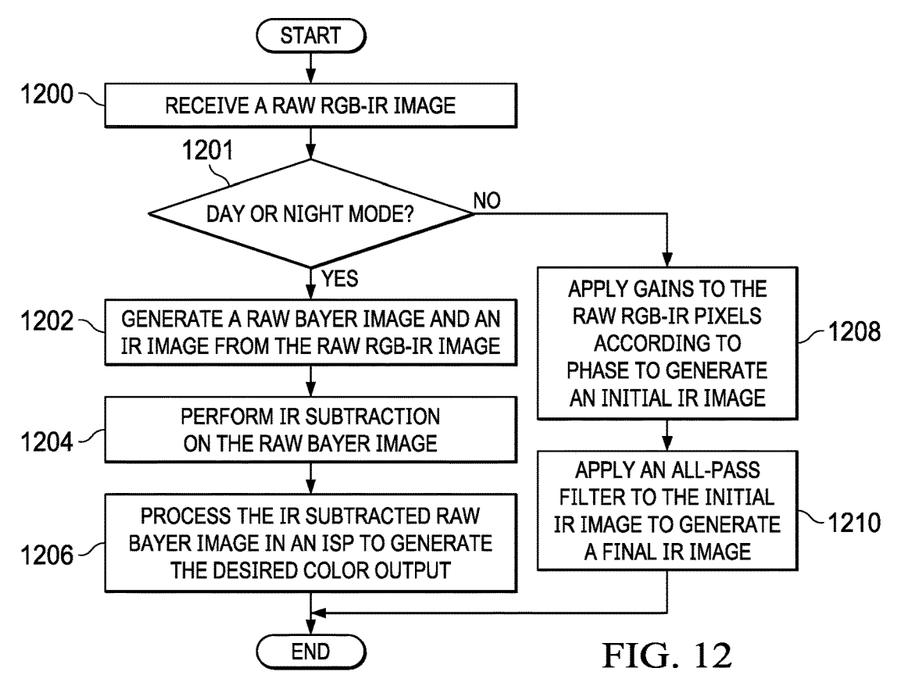
FIG. 12 is a flow diagram of a method for RGB-IR image processing.

FIG. 12 is a flow diagram of a method for RGB-IR image processing in accordance with some embodiments. Initially, a raw RGB-IR image is received 1200 and a decision is made 1201 as to whether to process the image in day mode or night mode. A method of selection of day or night mode is previously described herein. If day mode is selected 1201, a raw Bayer image and an IR image are generated 1202 from the raw RGB-IR image and IR subtraction is performed 1204 on the raw Bayer image to generate an IR subtracted raw Bayer image. Generation of a raw Bayer image and an IR image from aa raw RGB-IR image and IR subtraction are previously described herein. The IR subtracted raw Bayer image is then processed 1206 in an ISP to generate the desired color output.

If night mode is selected 1201, gains are applied 1208 to the raw RGB-IR pixels according to phase as previously described herein to generate an initial IR image and an all-pass filter is applied 1210 to the initial IR image to generate a final IR image.

Figure 13:
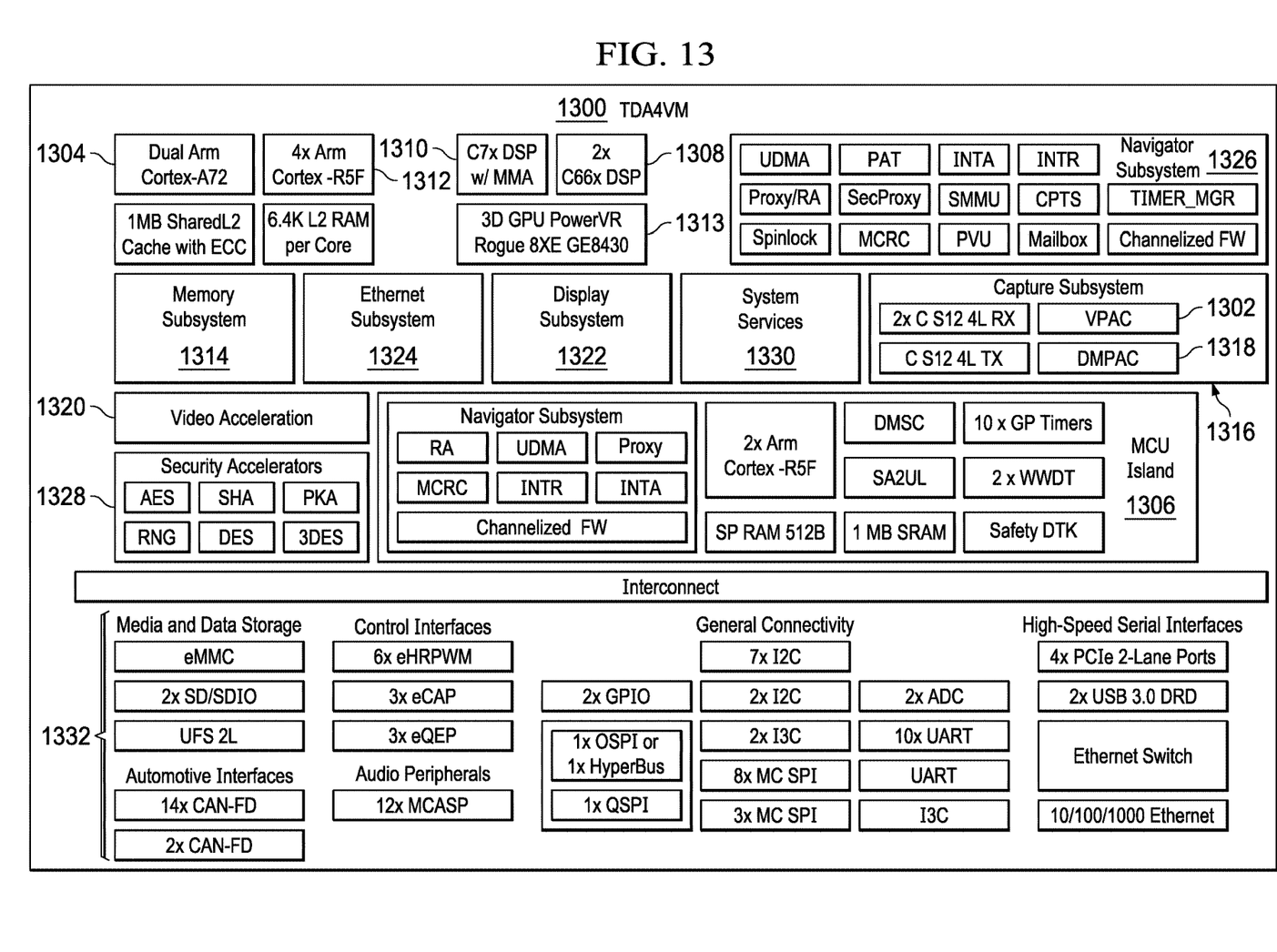
FIG. 13 is a high level block diagram of an example multiprocessor system on a chip (SoC)

FIG. 13 is a high level block diagram of an example multiprocessor system-on-a-chip (SoC) 1300 that may be configured to perform embodiments of raw RGB-IR sensor data as described herein. In particular, the example SoC 1300 is an embodiment of the TDA4VM SoC available from Texas Instruments, Inc. A high level description of the components of the SoC 1300 is provided herein. More detailed descriptions of example components may be found in "TDA4VM Jacinto™ Automotive Processors for ADAS and Autonomous Vehicles Silicon Revision 1.0," Texas Instruments, SPRSP36E, February, 2019, revised December, 2019, pp. 1-311, which is incorporated by reference herein.

The SoC 1300 includes numerous subsystems across different domains such as one dual-core 64-bit Arm® Cortex®-A72 microprocessor subsystem 1304, a microcontroller unit (MCU) island 1306, based on two dual-core Arm® Cortex®-R5F MCUs, four additional dual-core Arm® Cortex®-R5F MCUs 1312 in the main domain, two C66x floating point digital signal processors (DSPs) 1308, one C71x floating point, vector DSP 1310, that includes a deep-learning matrix multiply accelerator (MMA), and 3D graphics processing unit (GPU) 1313. The SoC 1300 further includes a memory subsystem 1314 including up to 8 MB of on-chip static random access memory (SRAM), an internal DMA engine, a general purpose memory controller (GPMC), and an external memory interface (EMIF) module (EMIF). In addition, the SoC 1300 includes a capture subsystem 1316 with two camera streaming interfaces, a vision processing accelerator (VPAC) 1302 including one or more image signal processors (ISPs), a depth and motion processing accelerator (DMPAC) 1318, and a video acceleration module 1320. The SoC 1300 also includes a display subsystem 1322, an ethernet subsystem 1324, a navigator subsystem 1326, various security accelerators 1328, support for system services 1330, and a variety of other interfaces 1332.

Software instructions implementing a configuration program as described herein may be stored in the memory subsystem 1314 (e.g., a computer readable medium) and may execute on one or more programmable processors of the SOC 1300, e.g., the DSP 1310. Further, the one or more ISPs in the VPAC 1302 may be, for example, embodiments of the ISP 800 of FIG. 8 and the CFA interpolation component 1000 of FIG. 10.

OTHER EMBODIMENTS

While the disclosure has been described with respect to a limited number of embodiments, those skilled in the art, having benefit of this disclosure, will appreciate that other embodiments can be devised which do not depart from the scope disclosed herein.

For example, embodiments are described herein in which the CFA interpolation component performs the IR subtraction. In some embodiments, the CFA interpolation component outputs the raw Bayer image and the IR image and the IR subtraction is performed in software to generate the IR subtracted raw Bayer image.

In another example, embodiments are described herein in which the IR gain block applies gains after a block of raw RGB-IR pixels is loaded into the pixel storage block of the CFA interpolation component and before the all-pass filter is applied. In some embodiments, the IR gain component may be placed at the input to the CFA interpolation component instead such that the gains are applied before pixels are loaded into the pixel storage block.

In another example, embodiments are described herein in which IR gains are applied by an IR block. In some embodiments, the gains are applied by appropriate configuring of the coefficients of the filter used to generate the final IR image.

In another example, embodiments are described herein in which generation of the IR image in night mode is a single pass operation. In some embodiments, the generation of the IR image is a two pass operation in which the first pass through the ISP generated the IR image and the second pass through the ISP improves the quality of the IR image.

In another example, embodiments are described herein in which a histogram of a green channel in an image is generated as a basis for selection between day mode and night mode. In other embodiments, a red or blue channel may be used.

In another example, embodiments are described herein in which the CFA interpolation component has four filters, each having four phases. In other embodiments, the CFA interpolation component may have other filter configurations.

In another example, embodiments are described herein in which diamond interpolation is used to interpolate red pixel values. In some embodiments, a gradient capability of the CFA interpolation component may be used to perform directional edge interpolation of red pixel values, e.g., horizontal edge interpolation in which the bottom red pixel of the diamond interpolation is not needed or vertical edge interpolation in which the right red pixel of the diamond interpolation is not needed.

It is therefore contemplated that the appended claims will cover any such modifications of the embodiments as fall within the true scope of the disclosure.

What is claimed is:
1. A method comprising:
   determining whether to process a raw RGB-Infrared (RGB-IR) image in day mode or night mode;
   responsive to determining to process in the day mode, interpolating the raw RGB-IR image to generate Bayer image data comprising a plurality of color pixel values and IR image data comprising a plurality of JR pixel values, and combining the Bayer image data with the IR image data to generate an IR subtracted Bayer image,
   wherein the combining includes weighting each of at least some of the plurality of color pixel values, weighting each of at least some of the plurality of IR pixel values, and subtracting each weighted IR pixel value from the corresponding weighted color pixel value to generate the IR subtracted Bayer image;

responsive to determining to process in the day mode, processing the IR subtracted Bayer image in an image signal processor (ISP); and responsive to determining to process in the night mode, generating an IR image from the raw RGB-IR image.

2. The method of claim 1, wherein determining whether to process in the day mode or the night mode comprises determining the day mode or the night mode based on pixel values in the raw RGB-IR image.

3. The method of claim 2, wherein determining whether to process in the day mode or the night mode further comprises:
computing a first histogram of a color channel in the raw RGB-IR image;
computing a second histogram of an IR channel in the raw RGB-IR image;
summing bins of the first histogram to generate a first sum until 50% of pixels in the color channel are included in the first sum;
summing bins of the second histogram to generate a second sum until 50% of pixels in the IR channel are included in the second sum; and
determining whether to process in the day mode or the night mode based on a difference between a bin number of the first histogram where the first sum included 50% of pixels in the color channel and a bin number of the second histogram where the second sum included 50% of pixels in the IR channel.

4. The method of claim 3, wherein the color channel is a green color channel.

5. The method of claim 1, wherein, in the combining:
each of the at least some of the color pixel values weighted by a weight of a first set of weight values; and
each of the at least some of the IR pixel values is weighted by a weight of a second set of weight values.

6. The method of claim 5, wherein the combining further comprises:
determining the at least some of the color pixel values on which to perform the subtracting based on comparison of a each color pixel value of the plurality of color pixel values to a saturation threshold.

7. The method of claim 5, wherein the combining further comprises:
skipping the subtracting for each color pixel value of the plurality of color pixel values having a color pixel value greater than a saturation threshold.

8. The method of claim 5,
wherein performing the subtracting on the at least some of the color pixel values further comprises:
for each IR pixel value of the at least some of the plurality of IR pixel values,
clipping an IR pixel value to an IR threshold to generate a clipped IR pixel value based on comparison of the IR pixel value to the IR threshold; and
subtracting the clipped IR pixel value from the corresponding weighted color pixel value.

9. The method of claim 8, further comprising computing the IR threshold as a percentage of the corresponding color pixel value.

10. The method of claim 1, wherein generating the IR image comprises:
applying a gain value to each pixel in the raw RGB-IR image to generate an initial IR image, wherein the gain value corresponds to a phase of the pixel; and
applying a filter to the initial IR image to generate the IR image.

11. The method of claim 1, wherein generating the IR subtracted Bayer image and generating the IR image are performed by the ISP.

12. A system-on-a-chip (SoC) comprising:
an image signal processor (ISP) configured to process a raw RGB-Infrared (RGB-IR) image in day mode or night mode, wherein, when configured for the day mode, the ISP is configured to interpolate the raw RGB-IR image to generate Bayer image data comprising a plurality of color pixel values and IR image data comprising a plurality of IR pixel values, and combine the Bayer image data with the IR image data to generate an IR subtracted Bayer image, the combine operation including weighting each of at least some of the plurality of color pixel values, weighting each of at least some of the plurality of IR pixel values, and subtracting each weighted IR pixel value from the corresponding weighted color pixel value to generate an IR subtracted Bayer image;
a memory configured to store software instructions implementing a control program for the ISP; and
at least one processor coupled to the memory to execute the software instructions,
wherein the software instructions, when executed by the at least one processor, cause the at least one processor to:
determine whether to process the raw RGB-IR image in the day mode or the night mode; and
configure the ISP accordingly.

13. The SoC of claim 12, wherein the software instructions to determine whether to process in the day mode or the night mode comprise software instructions to determine the day mode or the night mode based on pixel values in the raw RGB-IR image.

14. The SoC of claim 13, wherein the software instructions to determine whether to process in the day mode or the night mode further comprise software instructions to:
compute a first histogram of a color channel in the raw RGB-IR image;
compute a second histogram of an IR channel in the raw RGB-IR image;
sum bins of the first histogram to generate a first sum until 50% of pixels in the color channel are included in the first sum;
sum bins of the second histogram to generate a second sum until 50% of pixels in the IR channel are included in the second sum; and
determine whether to process in the day mode or the night mode based on a difference between a bin number of the first histogram where the first sum included 50% of pixels in the color channel and a bin number of the second histogram where the second sum included 50% of pixels in the IR channel.

15. The SoC of claim 14, wherein the color channel is a green color channel.

16. The SoC of claim 12, wherein to perform the combine operation, the ISP is configured to:
weight each of the at least some of the color pixel values by a weight of a first set of weights; and
weight each of the at least some of the IR pixel values by a a weight of a second set of weights.

17. The SoC of claim 16, wherein to perform the combine operation, the ISP is further configured to:
determine the at least some of the color pixel values on which to perform the subtracting based on comparison of each color pixel value of the plurality of color pixel values to a saturation threshold.

18. The SoC of claim 16, wherein to perform the combine operation, the ISP is further configured to:
skip the subtracting for each color pixel value of the plurality of color pixel values having a color pixel value greater than a saturation threshold.

19. The SoC of claim 16, wherein to perform the subtracting, the ISP is further configured to:
for each IR pixel value of the at least some of the plurality of IR pixel values,
clip an IR pixel value to an IR threshold to generate a clipped IR pixel value based on comparison of the IR pixel value to the IR threshold; and
subtracting the clipped IR pixel value from the corresponding weighted color pixel value.

20. The SoC of claim 19, wherein the ISP is further configured to compute the IR threshold as a percentage of the corresponding color pixel value.

21. The SoC of claim 12, wherein, when configured in the night mode, the ISP is configured to generate an IR image including performing operations to:
apply a gain value to each pixel in the raw RGB-IR image to generate an initial IR image, wherein the gain value corresponds to a phase of the pixel; and
apply a filter to the initial IR image to generate the IR image.

22. The method of claim 3, wherein generating the IR subtracted Bayer image comprises:
skipping subtracting for each color pixel value and other pixel values in a 2×2 Bayer array comprising the pixel color value based on comparison of the color pixel value to a saturation threshold.

23. The method of claim 3, wherein performing the subtracting on the at least one of the color pixel values comprises:
for each IR pixel value of the at least some of the plurality of IR pixel values,
clipping an IR pixel value to an IR threshold to generate a clipped IR pixel value based on comparison of the IR pixel value to the IR threshold; and
subtracting the clipped IR pixel value from the corresponding weighted color pixel value.

24. The SoC of claim 14, wherein to generate the IR subtracted raw Bayer image, the ISP is configured to:
skip subtracting for each color pixel value and other color pixel values in a 2×2 Bayer array comprising the color pixel value based on comparison of the color pixel value to a saturation threshold.

25. The SoC of claim 14,
wherein to generate the IR subtracted Bayer image, the ISP is configured to:
clip an IR pixel value to an IR threshold to generate a clipped IR pixel value based on comparison of the IR pixel value to the IR threshold; and
subtracting the clipped IR pixel value from the corresponding color pixel value.

26. The SoC of claim 21, wherein to apply the filter to the initial IR image, the ISP is configured to apply an all-pass filter to the initial IR image to smooth residual differences between channels.

27. The SoC of claim 21, wherein to apply the filter to the initial IR image, the ISP is configured to apply a low-pass filter to the initial IR image to eliminate high-frequency components introduced due to a difference in spectral responses of color channels.

* * * * *